(12) United States Patent
Chang

(10) Patent No.: US 7,892,412 B2
(45) Date of Patent: Feb. 22, 2011

(54) MANUFACTURING PROCESS OF EMBEDDED TYPE FLEXIBLE OR RIGID PRINTED CIRCUIT BOARD

(75) Inventor: Roger Chang, Xinzhuang (TW)

(73) Assignee: Mutual-Tek Industries Co., Ltd., Xinzhuang (TW)

( * ) Notice: Subject to any disclaimer, the term of this patent is extended or adjusted under 35 U.S.C. 154(b) by 838 days.

(21) Appl. No.: 11/850,830

(22) Filed: Sep. 6, 2007

(65) Prior Publication Data

US 2007/0295606 A1    Dec. 27, 2007

Related U.S. Application Data

(63) Continuation-in-part of application No. 11/197,332, filed on Aug. 5, 2005, now Pat. No. 7,297,285.

(51) Int. Cl.
*C25D 5/02* (2006.01)

(52) U.S. Cl. .................. 205/125; 216/13

(58) Field of Classification Search ............ 205/125; 216/13

See application file for complete search history.

(56) References Cited

U.S. PATENT DOCUMENTS

| | | | |
|---|---|---|---|
| 5,699,613 A * | 12/1997 | Chong et al. .................. 29/852 |
| 5,813,870 A | 9/1998 | Gaynes et al. |
| 6,240,636 B1 | 6/2001 | Asai et al. |
| 6,419,149 B1 | 7/2002 | Yano et al. |
| 6,815,709 B2 | 11/2004 | Clothier et al. |
| 7,297,285 B2 * | 11/2007 | Chang ........................ 216/13 |
| 2002/0081530 A1 | 6/2002 | Yamamoto et al. |
| 2004/0124533 A1 | 7/2004 | Keser et al. |

* cited by examiner

*Primary Examiner*—Luan V Van
(74) *Attorney, Agent, or Firm*—Snell & Wilmer L.L.P.

(57) ABSTRACT

A manufacturing process of an embedded type flexible or rigid printed circuit board includes multiple steps. First, a layer of dry film is applied to a layer of copper foil. Then a circuit pattern is formed on the copper foil through photolithography processes. An etching stop layer is electroplated on the copper foil according to the circuit pattern. The etching stop layer is then electroplated with copper. The copper foil is softened by a high temperature process after removing the dry film. Then the layer of the copper foil is etched after coating with an organic layer and the organic layer is solidified.

11 Claims, 7 Drawing Sheets

MANUFACTURING PROCESS OF EMBEDDED TYPE FLEXIBLE OR RIGID PRINTED CIRCUIT BOARD

RELATED APPLICATION

This application is a Continuation-in-Part of U.S. application Ser. No. 11/197,332 filed Aug. 5, 2005. The disclosures of the prior application is incorporated herein by reference.

TECHNICAL FIELD

The invention relates in general to a manufacturing process of an embedded type flexible or rigid printed circuit board, and more particularly to a structure design of an embedded type flexible printed circuit board wherein a circuit is directly formed on a carrier.

BACKGROUND OF THE INVENTION

Semiconductors are manufactured into a huge variety of electronic products. A conventional manufacturing technique for the semiconductors is to fabricate multiple pre-manufactured grain-shaped chips into semiconductor elements having external contacts or pins. Then the contacts or the pins of the semiconductor elements are soldered to be coupled with a circuit on a circuit board, so as to manufacture the electronic products with predetermined functions.

However, as the overwhelming trend in electronic products is towards developing portable and compact devices, a surface adhering technique is applied to secure the semiconductor elements to be coupled to the circuit board. Moreover, when fabricating the circuit board by using the surface adhering technique, excessive cost is inevitable due to high-priced raw materials. Hence the consumers have to decide between paying more for the state of the art products or choosing lower priced but less attractive products. Further, it is difficult for purchasing departments of companies to control and even predict the prices of those raw materials, especially when the material purchase orders must be signed long before the products can be manufactured.

SUMMARY OF THE INVENTION

It is therefore an objective of the present invention to provide a manufacturing process of an embedded type flexible or rigid printed circuit board, which can minimize the disadvantage of high-priced raw materials. The manufacturing process of an embedded type flexible or rigid printed circuit board of the present invention can produce a circuit board with the same effectiveness as the conventional circuit board fabricated by the high-cost surface adhesive technique.

According to another objective of the present invention, an entirely different application structure can be developed by switching the steps in the manufacturing process of the present invention.

In order to achieve the aforesaid objectives, the manufacturing process for an embedded type flexible or rigid printed circuit board of the present invention includes multiple steps as follows.

First, a layer of copper foil is prepared and the layer of the copper foil is coated with a layer of dry film or liquid type photo resist. A circuit pattern is formed after removing a part of the dry film or the photo resist. An etching stop layer of 3-10 um thickness is electroplated on the copper foil according to the circuit pattern. The etching stop layer is further electroplated with copper to form a circuit. Then the remained dry film or photo resist is removed. Next, the layer of copper foil is heated to become soft. The layer of copper foil is coated with an organic layer to cover the circuit, whereafter the organic layer is solidified such as by heating or UV. Then, the layer of the copper foil is etched, and the etching stop layer is also removed. Finally, the circuit is transferred to be embedded into the organic layer, and subsequently a surface of the circuit is processed with isolation coating, exposure, development, and a contact point surface process, so as to complete functionality of a circuit board.

The layer of the copper foil can be completely removed in the aforesaid step of etching the copper foil.

The layer of the copper foil can be partially removed in the aforesaid step of etching the copper foil.

With the aforesaid steps, the manufacturing process of the embedded type flexible printed circuit board of the present invention does not need use of a conventional carrier, so as to economize on the cost and further enhance competitiveness.

DETAILED DESCRIPTION OF THE PREFERRED EMBODIMENTS

Figure 1:
FIG. 1 to FIG. 11 illustrate the process for making a board with one circuit level according to the first embodiment of the present invention.
Figure 2:
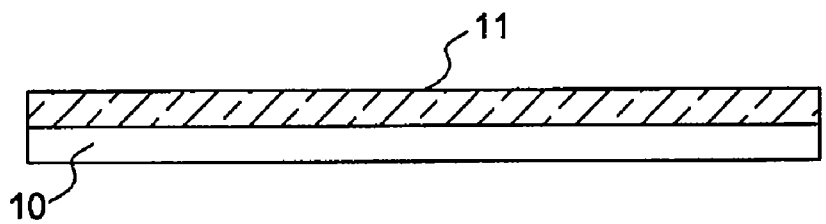
Figure 3:
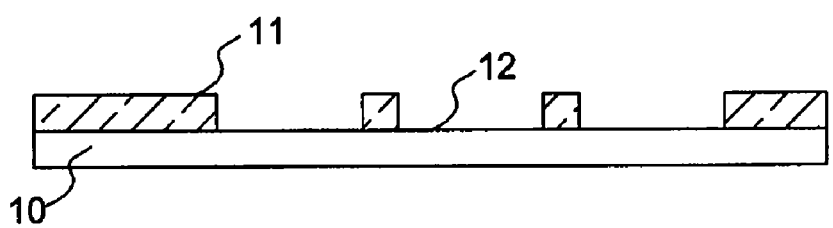
Figure 4:
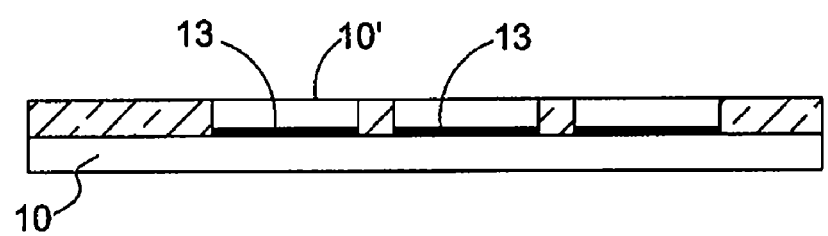
Figure 5:
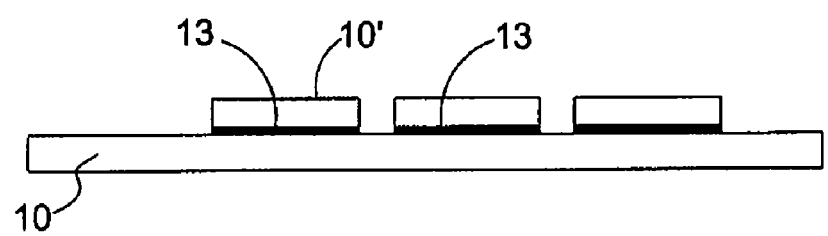
Figure 6:
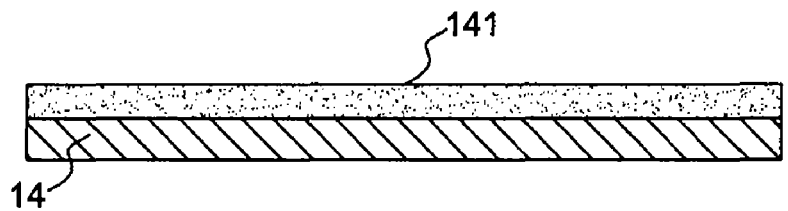

According to the aforesaid description of the manufacturing process of the embedded type flexible printed circuit board of the present invention, details are illustrated as follows.

FIG. 1 to FIG. 11 illustrate the first embodiment of the present invention. Referring to FIG. 1 to FIG. 9, a first step is to prepare a layer of copper foil 10 and the layer of the copper foil 10 is coated with a layer of dry film 11. A circuit pattern 12 is formed on the layer of the copper foil 10 after exposure and development of the dry film 11 by any conventional method. The layer of copper foil 10 is electroplated with an etching stop layer 13 of 3-10 um according to the circuit pattern 12. The etching stop layer 13 is electroplated with copper to form a first circuit 10'. Then the dry film 11 is removed from the layer of the copper foil 10. Next, the copper foil 10 is heated to become soft. A first organic layer 14 which includes an adhesive layer 141 is attached to the first circuit 10' by coating, adhering or compressing. The first organic layer 14 is then solidified by heating or irradiating of ultraviolet light (UV). Alternatively, the first organic layer 14 can be directly coated on the first circuit 10' without the adhesive layer 141. Next, the layer of the copper foil 10 is etched, and then the etching stop layer 13 is removed. Finally, the first circuit 10' is transferred from the layer of the copper foil 10 to the first organic layer 14. A surface of the first circuit 10' can be further processed with isolation coating, exposure, development, and a contact point surface process, so as to complete functionality of the circuit board.

The notable point is that the first organic layer 14 used in the present invention is a soft nonmetal organic material layer.

Accordingly, when the first organic layer 14 is attached to the first circuit 10', a part of the first organic layer 14 can be excluded to allow the first circuit 10' to embed into the first organic layer 14. After the first organic layer 14 is solidified, it becomes rigid to be a substrate. That is to say, the first organic layer 14 of the present invention has replaced the carrier (i.e. the layer of copper foil 10 for the conventional manufacturing process). Note that all the other organic layers to be described hereinafter are similar to the first organic layer 14.

The layer of the copper foil 10 can be completely removed in the aforesaid step of etching the layer of the copper foil 10.

Figure 10:
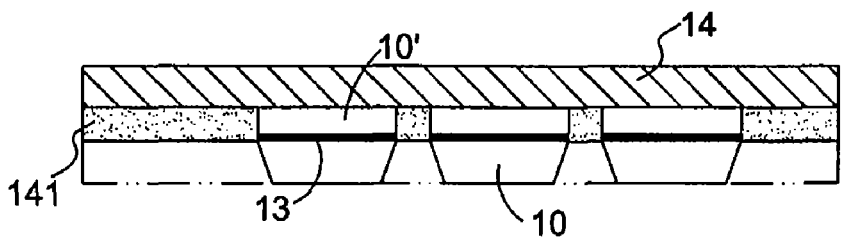

The layer of the copper foil 10 can be partially removed in the aforesaid step of etching step, so as to leave a part of the copper foil 10 that corresponds to the copper circuit 10' as shown in FIG. 10. The remaining copper foil 10 can function as electrode contact points to be coupled with other electrical components.

Figure 7:
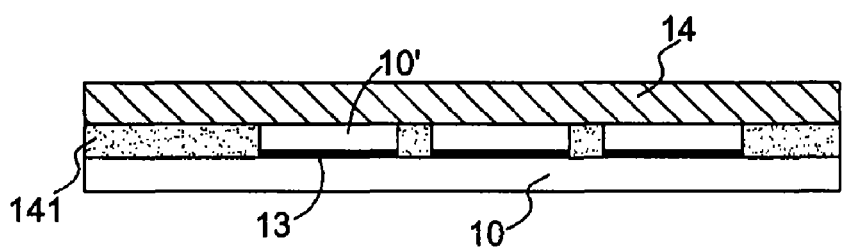
Figure 8:
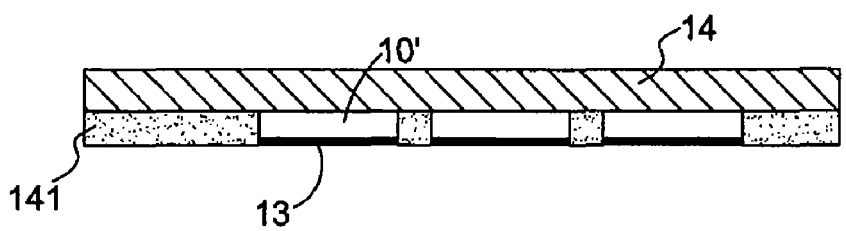
Figure 9:
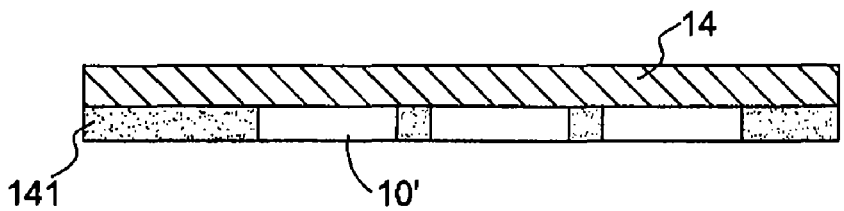
Figure 11:
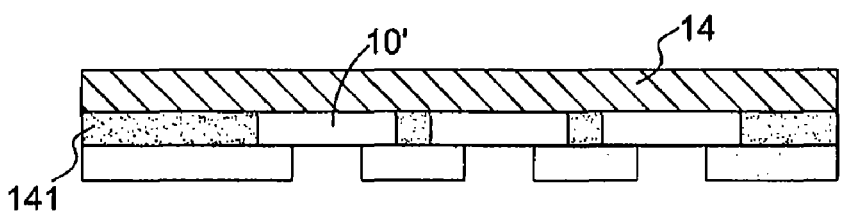

Referring to FIG. 11, a single side flexible board can be made by coating the structure shown in FIG. 9 with an insulating paint or by repeating the step in FIG. 7.

The aforesaid manufacturing process of the circuit board also can be used to manufacture a double-layered flexible printed circuit with copper on both sides, such as TAB (tape automatic bonding) and COF (chip-on-film) products also like TCP (Tape Carried Package).

The aforesaid manufacturing process of the circuit board can be further proceeded by stacking processes to form a multilayer structure with rigid parts or metal parts. Such multiplayer structures are illustrated through the second embodiment and the third embodiment to be described subsequently.

Figure 12:
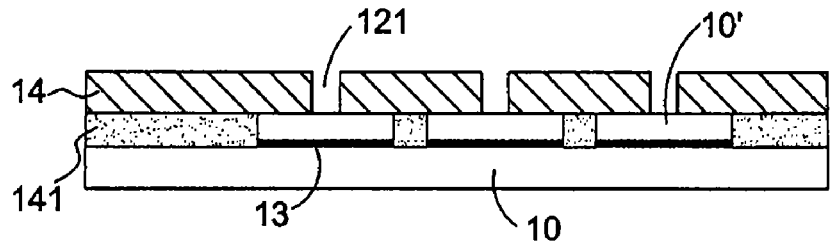
FIG. 12 to FIG. 18 illustrate the process for making another board with multiple circuit levels according to the second embodiment of the present invention.
Figure 13:
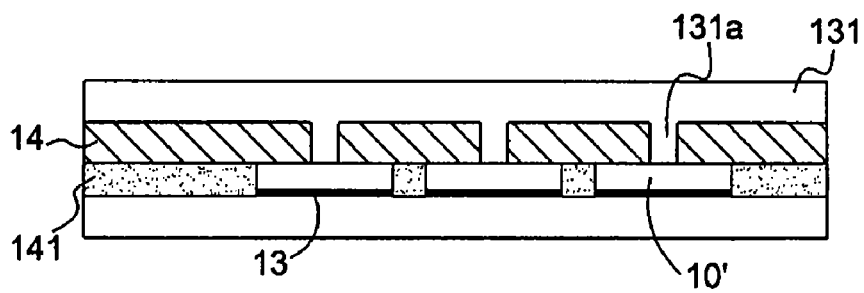
Figure 14:
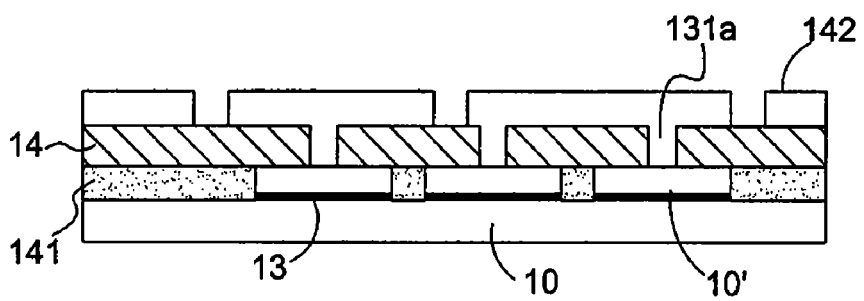

FIGS. 12 to 18 shows the second embodiment of the present invention. As shown in FIG. 12, the second embodiment starts by forming at least one hole 121 through the first organic layer 14 of the structure of FIG. 7. The hole 121 can be formed by any suitable method, such as laser drilling or lithography technology. Then, as shown in FIG. 13, a blanket conductive layer 131 is formed to cover the first organic layer 14 and fill up the hole 121 by electroplating. The filled hole 121 is referred to as a conductive via 131a. Subsequently, as shown in FIG. 14, the blanket conductive layer 131 is patterned to form a second circuit 142 by conventional lithography technology. Accordingly, the conductive via 131a connects the first circuit 10' with the second circuit 142. In addition to electroplating, the second circuit 142 also can be made by any other suitable technology, such as printing with conductive glues made of Cu, Ag, or carbon.

Figure 15:
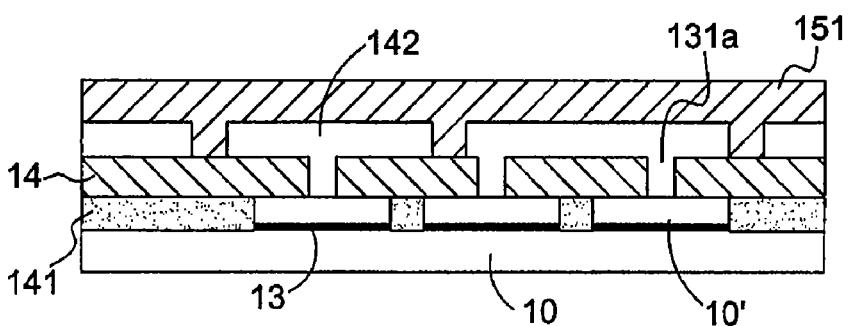
Figure 16:
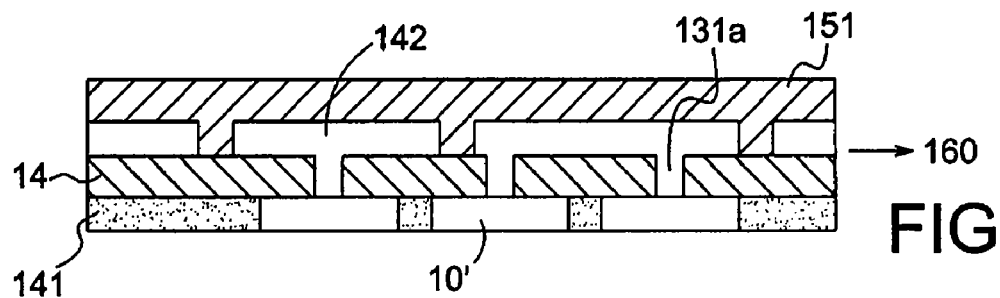

Next, as shown in FIG. 15, a second organic layer 151 is formed to cover the second circuit 142. Then, as shown in FIG. 16, the second organic layer 151 can be solidified to be rigid so as to remove the layer of the copper foil 10 by etching. Optionally, the etching stop layer 13 can be removed to expose the first circuit 10' as shown in FIG. 16. Note that after the aforementioned steps, a first laminate 160 including the first circuit 10', the first organic layer 14, the second circuit 130 and the second organic layer 151 is formed. The first laminate 160 can be protected by covering the top and the bottom surfaces with release films (not shown). Preferably, the release films are made of Teflon coated materials with high temperature endurance.

Figure 17:
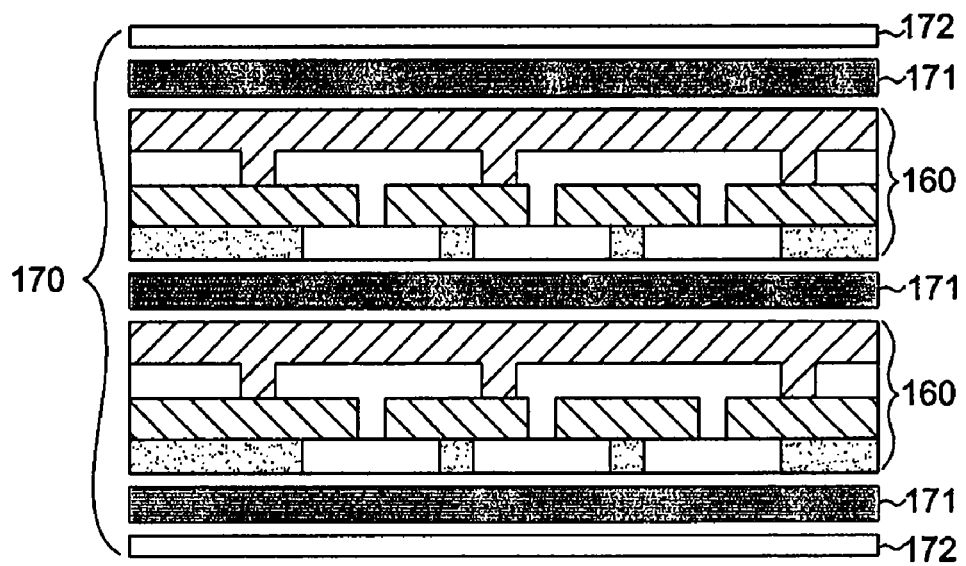

For making a multilayer printed circuit board, each first laminate 160 can serve as a core to be sandwiched by two insulating laminates 171. FIG. 17 illustrates a stack 170 including two first laminates 160 and three insulating laminates 171, in which each first first laminate 160 interposes between two of these insulating laminates 171. It should be understood that the numbers of the first laminates 160 and the insulting laminates 171 can vary depending upon how many circuit levels are to be made. The insulating laminate 171 can be any suitable dielectric sheet such as a conventional prepreg made of epoxy resin, polyimide, glass fiber or any other material. The stack 170 further includes two conductive laminates 172 respectively on the top and bottom of the stack 170. The conductive laminate 172 can be made by any suitable material, and a normal copper foil is preferred.

Figure 18:
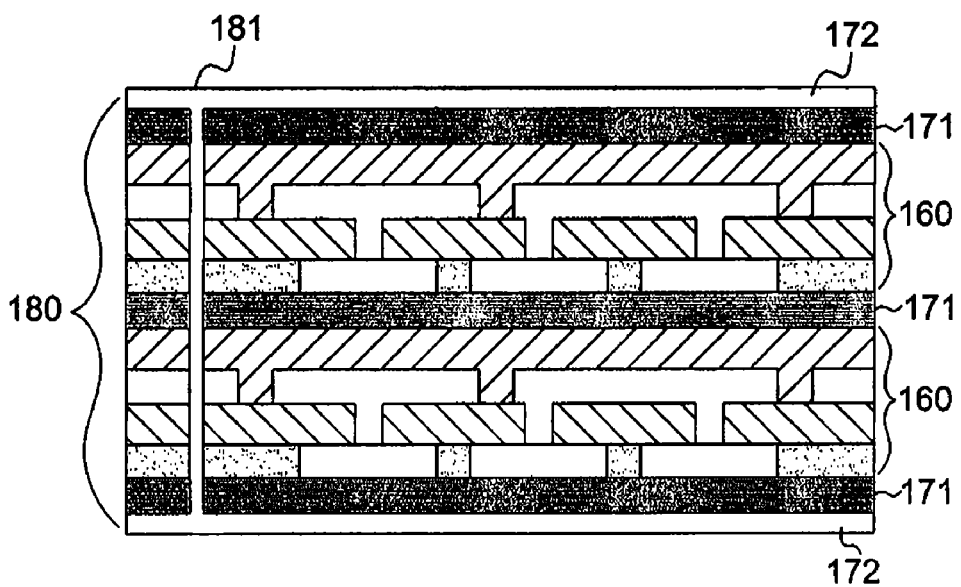

FIG. 18 shows a second laminate 180 formed by pressing the stack 170 of FIG. 17. The second laminate 180 is a typical multilayer printed circuit board with six circuit levels. In order to make interconnections with each circuit level, another conductive via 181 is built by drilling and electroplating.

Figure 19:
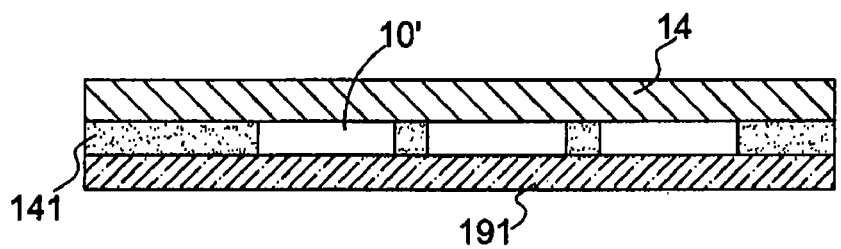
FIG. 19 to FIG. 25 illustrate the process for making another board with multiple circuit levels according to the third embodiment of the present invention.
Figure 20:
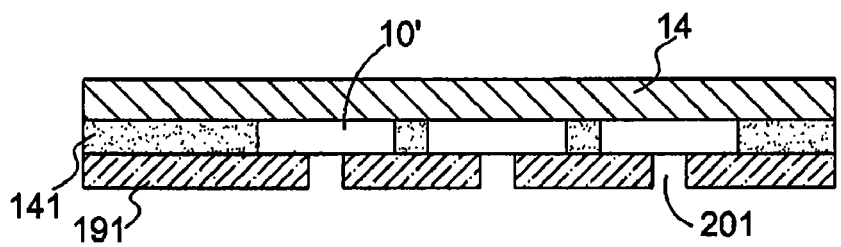
Figure 21:
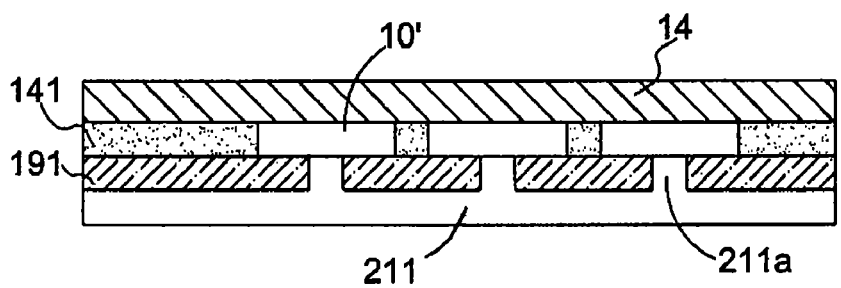
Figure 22:
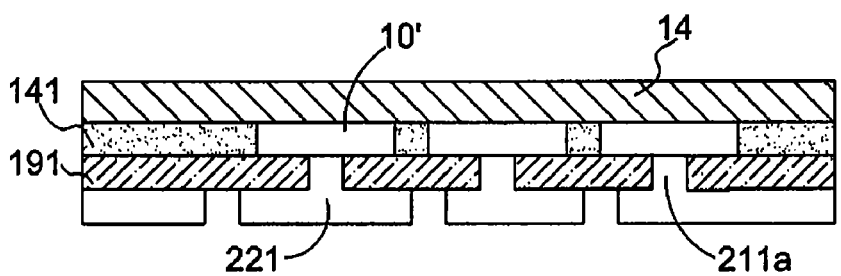

FIGS. 19 to 25 shows a third embodiment of the present invention. The third embodiment distinguishes from the second embodiment in that the third embodiment starts from the structure of FIG. 9 rather than FIG. 7. FIG. 9 is formed after removing the layer of copper foil 10 and the etching stop layer 13 of FIG. 7. Specifically, as shown in FIG. 19, the third embodiment starts by forming a second organic layer 191 to cover the exposed first circuit 10'. Then, as shown in FIG. 20, at least one hole 201 through the second organic layer 191 is formed by any suitable method, such as laser drilling or lithography technology. Next, as shown in FIG. 21, a blanket conductive layer 211 is formed to cover the second organic layer 191 and fill up the hole 201 by electroplating. The filled hole 201 is referred to as a conductive via 211a. Subsequently, as shown in FIG. 22, the blanket conductive layer 211 is patterned to form a second circuit 221 by conventional lithography technology. Accordingly, the conductive via 211a connects the first circuit 10' with the second circuit 221. In addition to electroplating, the second circuit 221 also can be made by any other suitable technology, such as printing with conductive glues made of Cu, Ag, or carbon.

Figure 23:
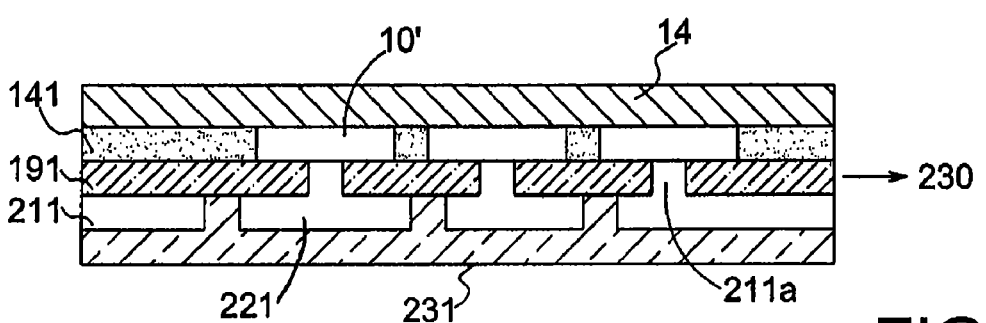

Next, as shown in FIG. 23, a third organic layer 231 is formed to cover the second circuit 221. Accordingly, after the aforementioned steps, a first laminate 230 including the first organic layer 14, the first circuit 10', the second organic layer 191, the second circuit 221 and the third organic layer 231 is formed.

Figure 24:
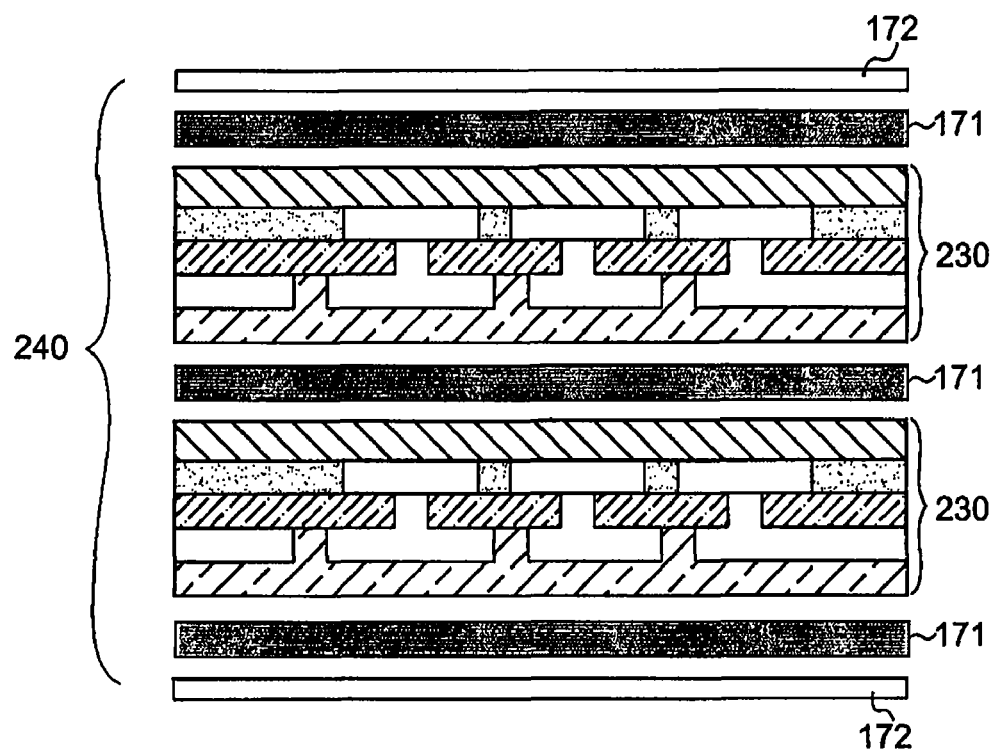

For making another multilayer printed circuit board, each first laminate 230 can serve as a core to be sandwiched by two insulating laminates 171. FIG. 24 illustrates a stack 240 including two first laminates 230 and three insulating laminates 171, in which each first laminate 230 interposes between two of these insulating laminates 171. As aforementioned, the numbers of the first laminates 230 and the insulting laminates 171 can vary depending upon how many circuit levels to be made. The stack 240 further includes two conductive laminates 172 respectively on the top and bottom of the stack 240.

Figure 25:
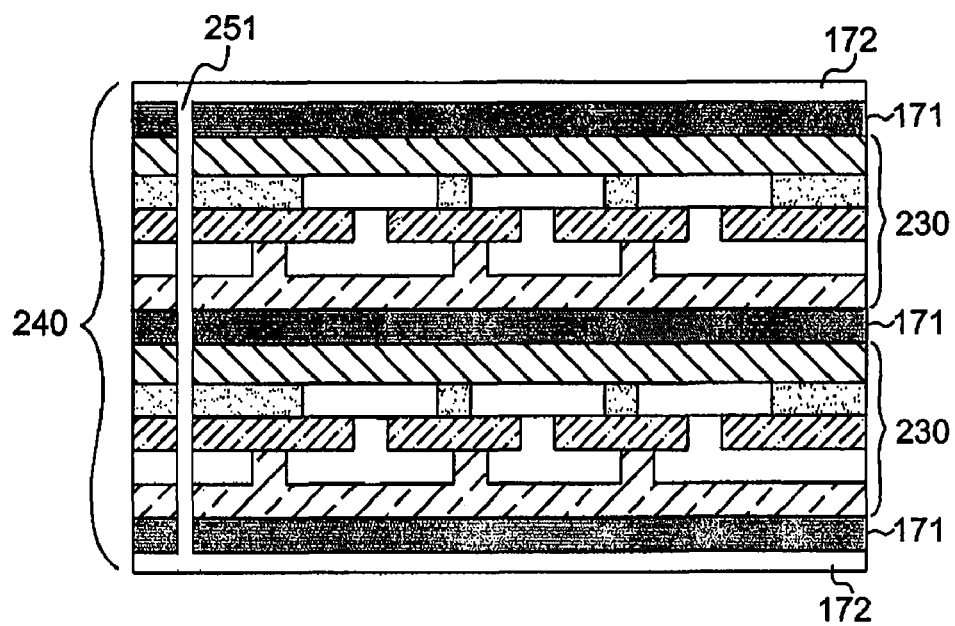

FIG. 25 shows a second laminate 250 formed by pressing the stack 240 of FIG. 24. The second laminate 250 is another typical multilayer printed circuit board with six circuit levels. In order to make interconnections with each circuit level, another conductive via 251 is built by drilling and electroplating.

Figure 26:
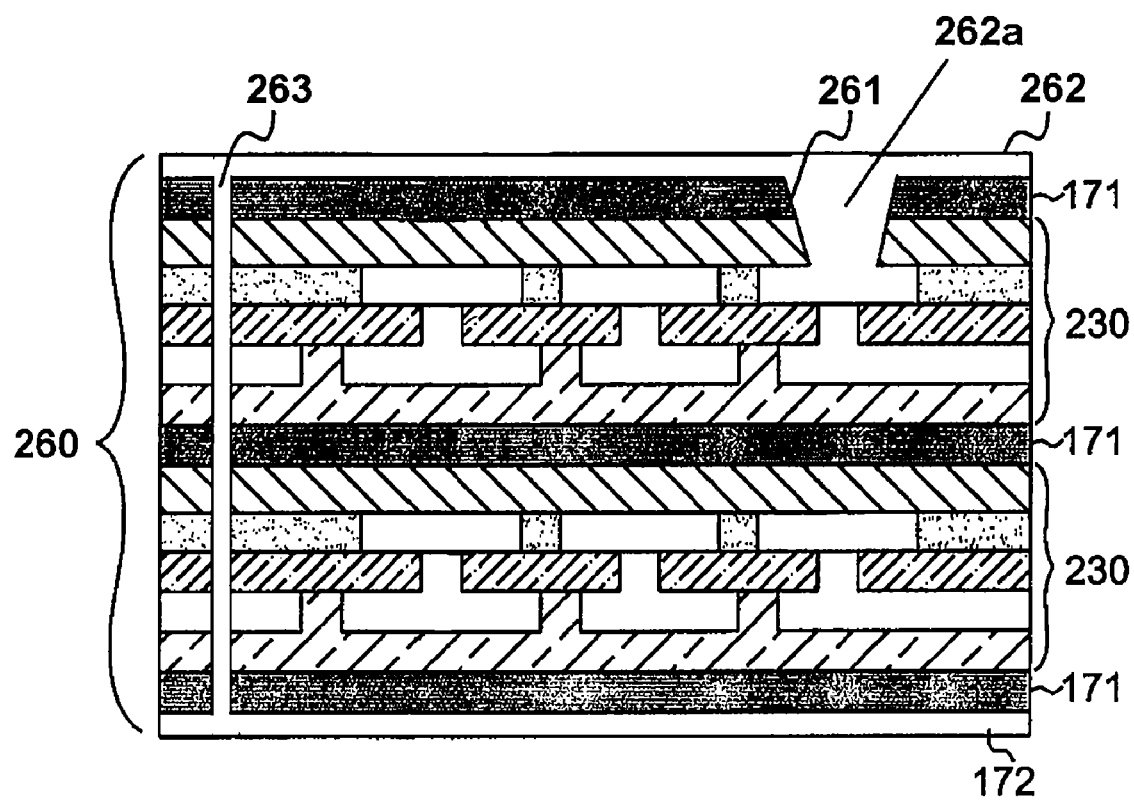
FIG. 26 illustrates the process for making another board with multiple circuit levels according to the fourth embodiment of the present invention.

FIG. 26 shows a fourth embodiment of the present invention. As shown in FIG. 26, a third laminate 260 is formed by pressing a stack having three insulating laminates 171 interlaced with two first laminates 230 and one conductive laminates 172 on the bottom of the stack. Next, a conductive via 263 interconnecting with each circuit level is built by drilling and electroplating. Then, an opening 261 is further formed to expose the first circuit 10' by laser drilling. Subsequently, a blanket conductive layer 262 is formed to cover the top insulating laminates 171 and fill up the opening 121 by electroplating. The filled opening 261 is referred to as a conductive via 262a.

With the aforesaid steps, the manufacturing process of the embedded type flexible printed circuit board of the present invention does not need use of a conventional carrier, so as to greatly reduce costs. Moreover, the circuit board of the present invention can achieve the objectives of the portability and compactness with the structure design of the embedded type flexible printed circuit board.

In conclusion, the manufacturing process of the embedded type flexible printed circuit board of the present invention indeed can improve the conventional drawback of high costs to produce the portable and compact products, and also provides high utilization values to the industry, so as to meet the requirements to apply a new patent.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of an embedded type printed circuit board, the method comprising the steps of:
   preparing a copper foil;
   coating the copper foil with a dry film;
   forming a circuit pattern on the copper foil by etching the dry film;
   electroplating an etching stop layer on the copper foil according to the circuit pattern;
   electroplating a first circuit on the etching stop layer;
   removing the dry film from the copper foil;
   heating the copper foil to become soft;
   forming a first organic layer on the copper foil;
   solidifying the first organic layer;
   etching the copper foil to expose the first circuit embedded in the first organic layer;
   forming a second organic layer on the first circuit;
   forming a conductive via in the second organic layer; and
   forming a second circuit on the second organic layer and the conductive via.

2. The manufacturing method as claimed in claim 1, further comprising:
   removing the etching stop layer after the step of etching the copper foil.

3. The manufacturing method as claimed in claim 1, wherein the etching stop layer of 3-10 um is formed.

4. The manufacturing method as claimed in claim 1, wherein the first organic layer is formed on the copper foil by compressing.

5. The manufacturing method as claimed in claim 1, wherein the first organic layer has an adhesive layer.

6. The manufacturing method as claimed in claim 1, the first organic layer is solidified by heating or irradiating of ultraviolet light.

7. The manufacturing method as claimed in claim 1, further comprising forming a third organic layer covering the second circuit.

8. The manufacturing method as claimed in claim 7, wherein a first laminate comprising the first organic layer, the first circuit, the second organic layer, the second circuit and the third organic layer is formed, and the manufacturing method further comprising:
   providing at least two insulating laminates and two conductive laminates;
   forming a stack by sandwiching at least one first laminate between the at least two insulating laminates and placing the two conductive laminates respectively on the top and bottom of the stack.

9. A manufacturing method of an embedded type printed circuit board, the method comprising the steps of:
   preparing a copper foil;
   coating the copper foil with a dry film;
   forming a circuit pattern on the copper foil by etching the dry film;
   electroplating an etching stop layer on the copper foil according to the circuit pattern;
   electroplating a first circuit on the etching stop layer;
   removing the dry film from the copper foil;
   heating the copper foil to become soft;
   forming a first organic layer on the copper foil to cover the first circuit;
   solidifying the first organic layer;
   forming a conductive via in the first organic layer;
   forming a second circuit on the first organic layer and the conductive via;
   forming a second organic layer on the second circuit; and
   removing the copper foil.

10. The manufacturing method as claimed in claim 9, further comprising:
    removing the etching stop layer after the step of removing the copper foil.

11. The manufacturing method as claimed in claim 9, wherein a first laminate comprising the first circuit, the first organic layer, the second circuit, and the second organic layer, and the manufacturing method further comprising:
    providing at least two insulating laminates and two conductive laminates; and
    forming a stack by sandwiching at least one first laminate between the at least two insulating laminates and placing the two conductive laminates respectively on the top and bottom of the stack.

* * * * *